United States Patent [19]
Switky et al.

[11] Patent Number: 5,185,653
[45] Date of Patent: Feb. 9, 1993

[54] O-RING PACKAGE

[75] Inventors: Andrew P. Switky, Palo Alto; Chok J. Chia, Campbell, both of Calif.

[73] Assignee: National Semiconductor Corporation, Santa Clara, Calif.

[21] Appl. No.: 661,962

[22] Filed: Feb. 28, 1991

Related U.S. Application Data

[63] Continuation-in-part of Ser. No. 610,640, Nov. 8, 1990, abandoned.

[51] Int. Cl.$^5$ .................. H01L 23/04; H01L 23/10
[52] U.S. Cl. .................. 257/729; 257/789; 257/666
[58] Field of Search .................. 357/70, 74, 72

[56] References Cited

U.S. PATENT DOCUMENTS

| | | | |
|---|---|---|---|
| 3,714,370 | 1/1970 | Nixen et al. | 357/74 |
| 4,629,824 | 12/1986 | Gilder et al. | 357/70 |
| 4,859,632 | 8/1989 | Lumbard | 357/70 |
| 4,899,207 | 2/1990 | Hallowell et al. | 357/70 |

Primary Examiner—Rolf Hille
Assistant Examiner—S. V. Clark
Attorney, Agent, or Firm—Gail W. Woodward; Irving S. Rappaport; James W. Rose

[57] ABSTRACT

A transfer molded plastic package having a cavity for accommodating a semiconductor chip is disclosed. A leadframe assembly process is shown wherein the leadframe finger pattern is provided with a resilient or elastic O-ring bead. Top and bottom housing plates which have dimensions that are larger than the bead form the upper and lower surfaces of the package. These plates can be formed of any suitably rigid material. They may be composed of ceramic in low power devices. For high power operation at least one metal plate can be employed. The chip or chips are connected to the lead frame and, along with the top and bottom plates, is located in a transfer mold. The plates are in registy and located so that their outer edges extend beyond the O-ring bead. The mold cavities include faces which press against the plates which are held apart by the O-ring bead so that the bead is compressed by the mold closure. A plastic encapsulant is molded around the periphery of the plates so that the leadframe fingers are secured therein to become package pins.

11 Claims, 2 Drawing Sheets

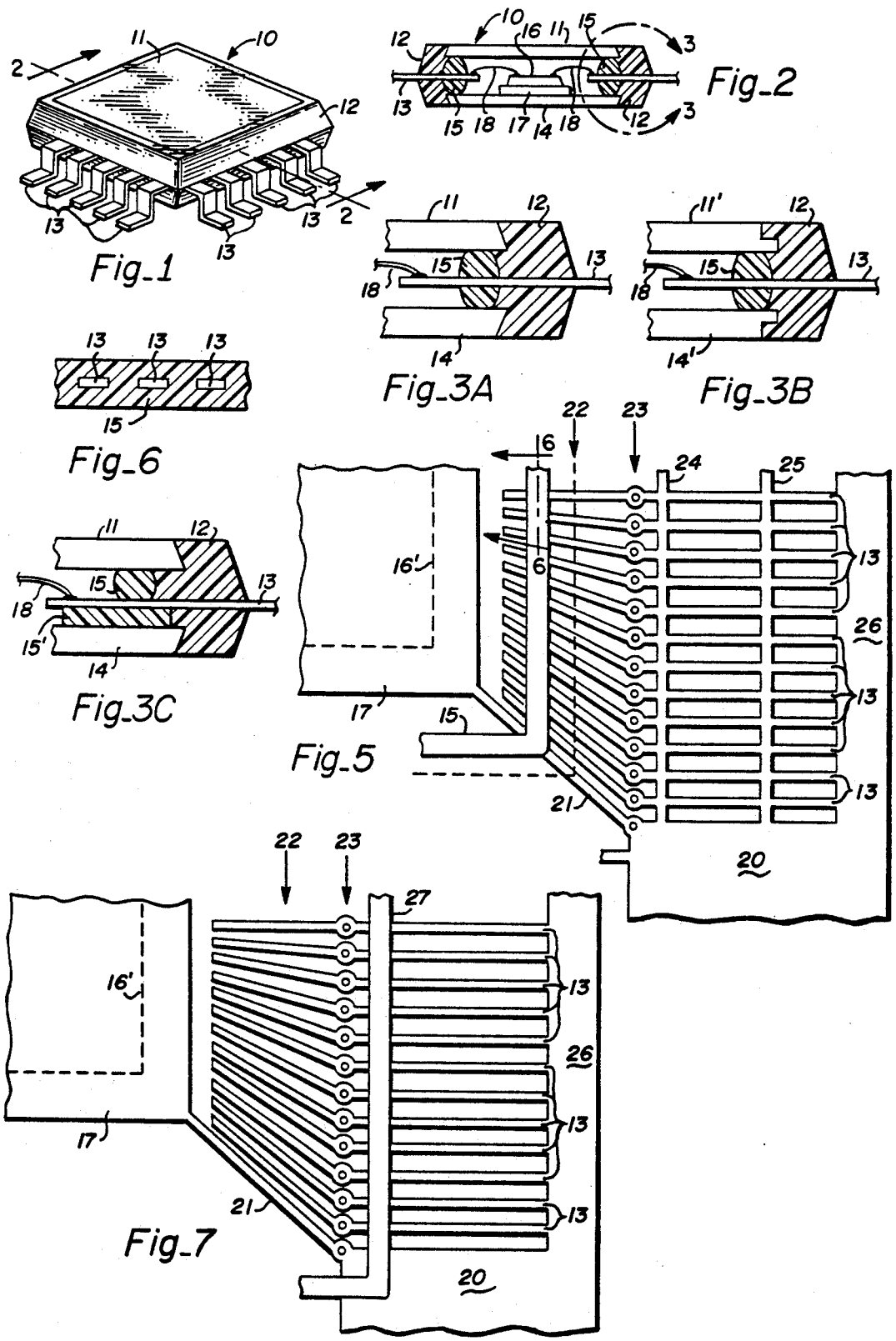

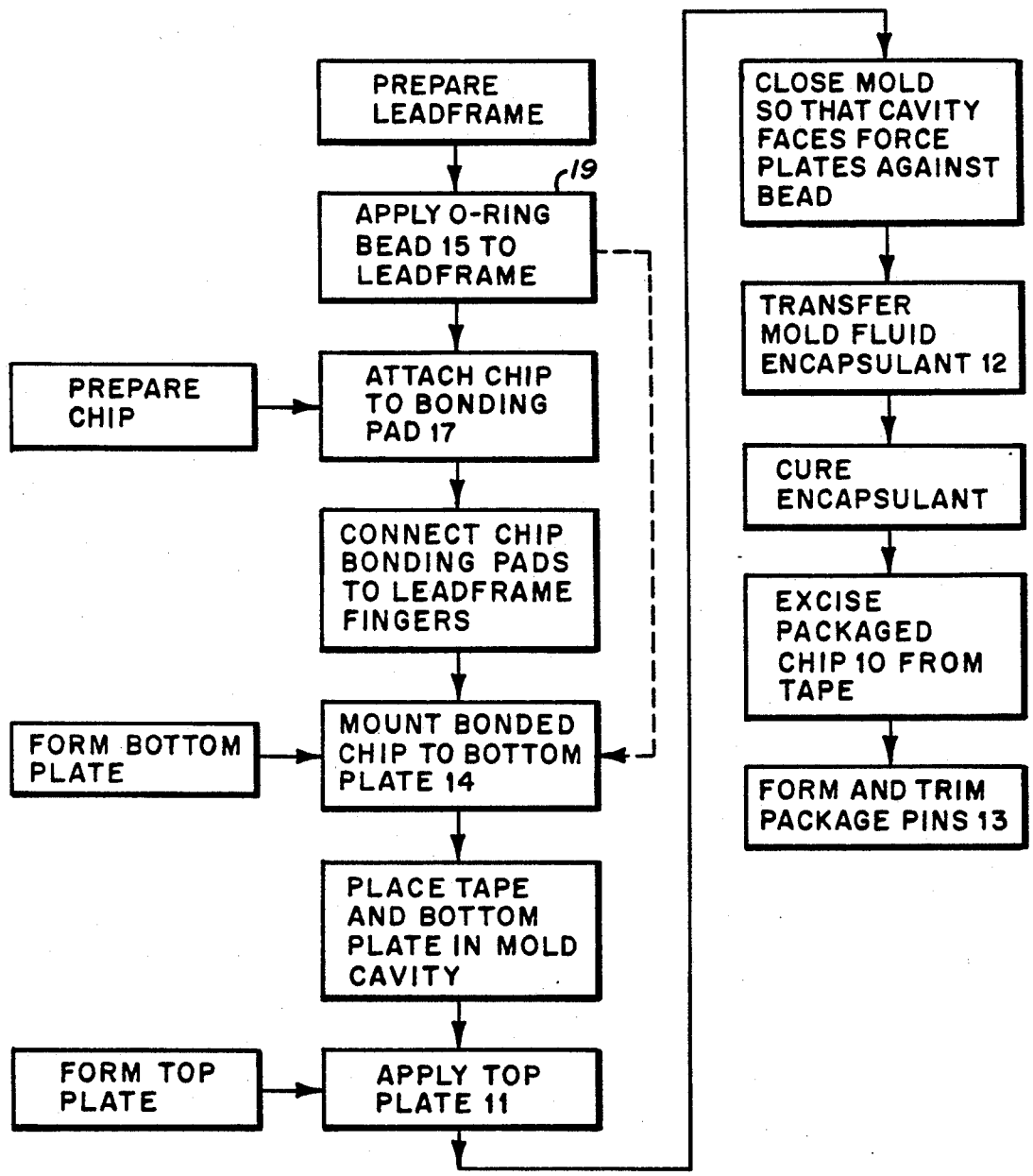
Fig_4

O-RING PACKAGE

BACKGROUND OF THE INVENTION

This is a continuation-in-part of application Ser. No. 610,640, filed Nov. 8, 1990, (now abandoned).

The invention relates generally to the field of semiconductor device packaging and specifically relates to the transfer molding of plastic encapsulated devices. Ceramic hermetic semiconductor packaging is the preferred way of high reliability packaging because it offers several desired advantages Mainly, once sealed, the package is substantially impervious to its environment. The final seal can be accomplished in an environment that is not stressful to the semiconductor device and this environment will be maintained throughout the life of the device. However, such packages have proven to be expensive. In many cases the cost of the package greatly exceeds the cost of producing the chip that it houses. On the other hand, the well known plastic molded semiconductor devices can be produced cheaply. Typically, the chip being housed costs more to produce than the package and this is a desirable economic condition. Plastic encapsulation, while cheap and easy to accomplish, has several disadvantages. For most of these is the problem that such encapsulation is not hermetic. Such packaging allows the long term entry of environmental elements which can adversely affect a semiconductor chip. While this is a difficult problem, the producers of chips have advanced their use of protective seal coatings to a point where hermetic sealing is not necessary. The reliability of plastic encapsulated semiconductor chips in the presence of adverse environments has advanced to a level where hermetic packaging is not always attractive. Certainly the cost/benefit relationship now militates against hermetic packaging. This leaves the device designer with the other problems associated with transfer molding. These include the problems of stress which develops when the plastic encapsulant comes into contact with the semiconductor chip face. Such stress, in the extreme, can result in chip fracture during temperature cycling. Also, some semiconductor chips are sensitive to stress and their operating characteristics will change during encapsulation. Finally, many semiconductor chips require post assembly characterization such as PAL (programmed array logic) devices. In one such heirarchy, fuses are blown to disconnect crossbar switch arrays to produce a desired pattern. With plastic encapsulation, fuse blowing is difficult because the metal vapors thus produced have nowhere to go. Consequently, such programming is done only on cavity-type ceramic packaged devices. It would be desirable to have a cavity type plastic encapsulated package.

In the transfer molding of plastic encapsulated devices, it is common to employ a dambar on the leadframe to control mold flash. The dambar structure is designed to mate with the edge of the cavity in the molding die which creates the final plastic block. After the molding is completed the dambar segments that join the leads together are removed so that the leads are functionally separate. This requires a separate fabrication step and, with the high lead count packages now being favored, can be a difficult task. In fact, when the device dimensions reduce the lead spacing to about 12 mils (0.3 mm) mechanical punches become impractical. At this point, it has become standard practice to use a narrow focussed laser beam to do the cutting. In the square packages, now becoming popular, high lead count packages having 150 to 200 pins result in spacings that make dambar removal very difficult. Accordingly, a modification in the dambar system would be desirable.

SUMMARY OF THE INVENTION

It is an object of the invention to incorporate an O-ring onto the leadframe that is to be used to connect a semiconductor device to its pins in a plastic molded structure wherein the O-ring prevents molding compound from contacting the semiconductor device.

It is a further object of the invention to employ a pair of plates to form a semiconductor device package and to separate the plates by means of a compliant elastic bead or O-ring formed on the package leadframe whereby the plate spacing is maintained to clear the semiconductor device incorporated onto the leadframe and the edges of the plates can be joined together with a molded plastic ring.

It is a still further object of the invention to employ metal plates to create a semiconductor device package where the plates are spaced apart by means of an O-ring bead incorporated into the leadframe and the semiconductor device can be associated intimately with a metal plate to create a high power device.

It is a still further object of the invention to employ a dambarless leadframe for producing a plastic molded semiconductor device package in which an O-ring bead is located upon the leadframe to prevent mold flash and thereby to define the molded plastic outline.

These and other objects are achieved in the following manner. A semiconductor package is created using a pair of relatively rigid plates to define the upper and lower package surfaces. These plates can be made of any suitably rigid material. For example, they can be composed of low cost ceramic, or they can be composed of metal where high power dissipation is desired. The plates are spaced apart by means of a resilient or elastic insulating O-ring that is located upon the leadframe that is to be employed in creating the package. The O-ring is formed upon the leadframe outboard of the semiconductor chip region and inboard of the edges of the plates to be employed in creating the package. The semiconductor chip (or chips) is associated with the leadframe and the leadframe fingers connected to the chip bonding pads. Then, the leadframe and semiconductor chip are associated with one of the package plates and the assembly, along with an oriented second plate, is placed in a transfer mold which has a cavity that will accommodate the assembly. The mold cavity faces press against the plates which are therfore pressed against the leadframe bead so that the O-ring is compressed and therefore holds them separated on either side of the semiconductor chip. Then a conventional plastic ring is transfer molded around the edges of the plates so that the lead frame fingers extend therethrough in the conventional manner. In this molding system the O-ring bead will prevent the ingress of molding compound and the plates, along with the bead, will form a cavity around the semiconductor chip. The periphery of the plates will be surrounded by the molded plastic which will also join them together to create a unitary package structure. If desired, the plate edges can be shaped to key into the plastic so that they are rigidly retained.

When a high lead-count package is to be created a leadframe having no dambars can be employed. Here an insulating resilient or elastic O-ring is formed in the region where a dambar would ordinarily be located. This O-ring is made relatively thin and in registry with the encapsulation molding die cavity edges. When the molding die is closed the cavity edges mate with the O-ring which is thereby compressed and will act to preclude molding flash. Thus, the O-ring will define the outer edges of the molded plastic and the conventional dambars are not needed.

BRIEF DESCRIPTION OF THE DRAWING

The drawing is not to scale. Dimensions have been exaggerated to more clearly portray the invention.

FIG. 1 is a front elevation view of a square package using the invention.

FIG. 2 is a cross-section of the FIG. 1 structure take at line 2—2.

FIGS. 3A, 3B and 3C are an enlarged views of the seal region of the FIG. 2 showing taken at line 3—3. FIG. 3A shows a seal made using metal plates that are punched out of sheet stock, FIG. 3B shows a seal made using plates having reentrant formed edges--, and FIG. 3C shows a form of o-ring construction in which the lower portion is a flat tape segment that is overlaid with a compliant bead.

FIG. 4 is a block diagram showing the process for practicing the invention.

FIG. 5 is a segment of a metal leadframe showing the finger structure and the location of a compliant O-ring which operates to create the semiconductor device package.

FIG. 6 is a fragmentary cross section of ring 15 taken at the line designated 6—6.

FIG. 7 is a segment of a metal leadframe that has no dambars and includes a plastic O-ring in place of the conventional mold-flash preventing dambar.

DESCRIPTION OF THE INVENTION

The invention is embodied in the semiconductor device package 10 portrayed in FIG. 1. A plate 11, which is flush with the upper surface, is held in registry with a bottom plate (not visible in FIG. 1) by means of a plastic ring 12 molded in place. Leads 13 pass through the plastic ring in the manner well known in the plastic encapsulated package art. The leads 13 are created in the conventional leadframe manner and encased conventionally in molded plastic ring 12. While copper is preferred as the leadframe material, other suitable metals can be employed.

FIG. 2 is a cross-section of the FIG. 1 package 10 taken at line 2—2. FIGS. 3A, 3B and 3C show enlarged alternative forms of the plastic seal region of FIG. 2. Top plate 11, with its bottom plate 14 counterpart, create a cavity-type of package by virtue of a resilient plastic bead 15 which was formed on the leadframe that incorporates leads 13 prior to assembly.

In FIG. 3A plates 11 and 14 have sloped edges that can be created by the punch faces employed in the metal plate punching operation. In FIG. 3B plates 11' and 14' have reentrant edges created typically by a machining operation. In either form the edge shape will cooperate with plastic ring 12 to key the plates into their final position.

In FIG. 3C the resilient bead 15 is applied to only the upper side of leads 13. The bottom side of leads 13 are provide with a flat ring 15' of suitable tape such as sheet polyimide.

FIG. 4 is a block diagram of the preferred package assembly process. The critical step of the process is at block 19 where the O-ring is applied. A semiconductor device chip 16 is prepared conventionally and is mounted upon a leadframe bonding pad 17 which in turn is associated with bottom plate 14. The bonding pads on chip 16 are connected to the leadframe fingers 13 by means of wires 18.

The package 10 is created in the following preferred manner. First, a leadframe is prepared in the usual manner and a resilient plastic bead 15 applied in the form of a ring that surrounds the chip bonding pad so that the inner extensions of the leadframe fingers extend inside the ring. The ring has a diameter that is smaller than plates 11 and 14. Desirably, the ring is formed of a polyimide such as Dow Corning R-6102 which is purchased as a liquid monomer. The monomer can be silk-screened onto the leadframe or deposited by way of a moving syringe. If desired, it can be molded in place on the leadframe. After a suitable monomer has been applied it is cured in position in accordance with the preferred heating schedule. For example, heating for one hour at 70° C. is followed by two hours at 150° C. Alternatively, an RTV silicon rubber can be applied in liquid form and cured in place.

As shown in the alternative embodiment of FIG. 3C, the ring can be produced by first cementing a flat plastic ring to the underside of leads 13 and then applying the bead 15, as described above, to the topside of the leads. Plastic ring 15' is preferred to be sheet polyimide coated with B-staged epoxy which will glue the faces to both the leads 13 and button plate 14. In this embodiment of the invention the bonding pad 17 can be eliminated, if desired, and chip 16 secured directly to bottom plate 14.

Ring 15 is made sufficiently thick that plates 11 and 14 must be pressed against it to provide the desired package thickness. This compression is achieved inside the plastic encapsulation transfer mold which is used to apply ring 12, as will be described hereinafter. After bead 15 is formed on the leadframe, semiconductor chip 16 is attached to the leadframe bonding pad. (While the preferred O-ring application is shown prior to chip attachment, it can, if desired, be applied after the semiconductor chip is associated with the leadframe. This alternative is shown by the dashed line in FIG. 4.) The chip bonding pads are connected to the leadframe fingers inside the plastic ring by conventional wire bonds. Suitable clearance between wires 18 and top plate 11 is provided by making bead 15 sufficiently thick. However, if desired upper plate 11 can be provided with a recess to accommodate the wires. Where aluminum wire bonding is to be employed, the leadframe bonding pad and the inner ends of the metal fingers may be coated with a layer of aluminum. This provides a suitable surface for the copper leadframe which will readily accept ultrasonically bonded aluminum wires.

Alternatively, thermocompression bonding can be employed to connect the chip bonding pads to the tape fingers. In this assembly method the leadframe bonding pad can be eliminated. In this operation, which relates to tape assembly bonding (TAB), a thin copper intermediate leadframe is created to have an inwardly extending finger pattern that mates with the chip bonding pads. These finger patterns have an outwardly extending form which mates with the leadframe fingers. First, the TAB fingers are thermocompression gang bonded to the chip bonding pads in an innerlead bond. Then, the chip and its associated fingers are excised from the TAB assembly tape. The chip-associated fingers are then thermocompression gang bonded to the leadframe fingers in an outer lead bond. In the TAB assembly the connections between the chip and its package are flat and very little clearance is required below top plate 11. Furthermore, if desired, the leadframe fingers can be so constructed that they mate directly with the IC chip bonding pads. Thus, if desired, the chip can be directly associated with the leadframe using TAB and the intermediate leadframe dispensed with.

It is to be understood that while a single semiconductor chip is illustrated, multichip structures can be employed. Here several chips are attached to the bonding pad (or directly to plate 14) and interconnected to the leadframe fingers as described. Thus, relatively complex circuitry can be accommodated.

After the chip is mounted and connected to the leadframe tape fingers, the leadframe bonding pad is secured to bottom plate 14. Alternatively, if the leadframe bonding pad has been eliminated, as mentioned above, the chip 16 is attached directly to lower plate 14. This is done typically by soldering, but the use of an adhesive bond is available, if desired. For example, a silver particle loaded polyimide cement will provide a suitable thermal conductivity and a reliable resilient long term stable assembly. Such a bond is very useful in the case where the thermal expansion of bottom plate 14 is substantially different from that of chip 16. If desired, the O-ring 15 can be cemented to the bottom plate by one or more beads of cement thereby forming a well-established assembly.

In the case of FIG. 3C where the bottom portion 15' of O-ring 15 is a tape, the B-staged epoxy face can be employed to bond it to plate 14.

Then the tape with the attached chip 16 and bottom plate 10 is placed on the lower platen in an encapsulation transfer mold. The mold platen has a recess or cavity in which the broad face is larger than lower plate 14. Top plate 11 is then placed on top of the assembly in registry with bottom plate 14. If desired, the top plate can also be cemented in place on leadframe O-ring bead 15. The transfer mold is then closed so that a cavity in the upper platen is in registry with the lower platen cavity. The transfer mold platens are constructed so that when closed the cavity faces are closer together than the sandwich comprised of the bead 15 along with plates 11 and 14. Thus, the assembly is compressed so that the bead 15 is squeezed to flatten it. This action provides a seal that will preclude the entry of fluid encapsulant during transfer molding. The fit between the plates and the mold cavity faces is such that the fluid encapsulant is also excluded from the plate faces. Accordingly, when the fluid encapsulant is forced into the mold cavity it creates a ring 12 of plastic encapsulant surrounding plates 11 and 14.

FIG. 5 shows a leadframe pattern suitable for practicing the invention. The fragmental drawing shows only one corner of the leadframe finger pattern for clarity. The drawing shows a pattern segment that will be repeated seven more times to develop a single complete finger pattern. Therefore, while twelve fingers are illustrated, the finished package will have 96 pins arrayed on four sides as is generally illustrated in the 20-pin package structure of FIG. 1. The leadframe chip bonding pad 17 is attached at its four corners to fingers, one of which is shown at 21. Four such fingers will join pad 17 to the main tape segment 20. It is to be understood that if TAB spider bonding is to be employed, as described above, the pattern shown in FIG. 5 would exclude pad 17 and finger 21. Plastic bead 15 is applied to the tape fingers as described above and its location is inside dashed line 22 which represents the edges of upper plate 11 and lower plate 14. The finger pattern includes an array of inner ends that stop short of bonding pad 17 and outer extensions 13 which will ultimately form the package pins. The finger pattern optionally includes a row 23 of enlarged sections each one of which includes a central hole. Also, a series of metal links at 24 join the adjacent fingers together so that a dambar is created. When the package is transfer molded, the mold includes a cavity having edges that are in registry with the left hand end of dambar 24. Thus, when the transfer molding is operated, the dambar prevents a mold flash by constraining the exit of fluid molding compound. When the transfer molding is performed the plastic encapsulant will pass through the holes in the fingers so that after curing the leadframe will be securely keyed to the plastic.

It will be noted that a second dambar type of structure is present at 25. This bar is optionally employed where fingers 13 are relatively long and acts to maintain the fingers in their desired location during handling.

After the transfer molding is accomplished the plastic is cured so that the plastic ring 12 is complete with metal fingers 13 extending outwardly therefrom. Then the assembly is excised from the assembly tape and the dambar elements are removed by such means as punching, clipping or laser beam vaporization. This latter method is the one of choice for the highest lead-count packages. In fact, the ability to remove the dambars is one of the main limits in producing the higher leadcount structures. After excision, the package leads are formed to a desired shape, cleaned and provided with a corrosion resistant coating. The package is then ready for use.

FIG. 7 shows a tape structure in which the dambars are eliminated. This is known as the dambarless tape assembly method and structure. The drawing is similar to that of FIG. 5 except for the lack of dambars. It is to be understood that while the dambarless tape assembly is of greatest use on large lead count packaging where dambar removal presents problems, it can be employed in any transfer molded process where molding flash is to be avoided.

As shown in FIG. 7, a plastic bead 27 is applied to the leadframe which is shown as being generally similar to that of FIG. 5. Siderail 26 joins the outer ends of fingers 13 and bead 27 holds the inner ends of the fingers in position. If the inner extremities are to be further secured in position, a polyimide tape (not shown) could be applied in the conventional way at location 22 to ensure finger stability. As usual, a semiconductor chip is mounted on lead frame bonding pad 17 inside the area bounded by dashed line 16'. Then the chip bonding pads are connected to the inner ends of the tape fingers by means of wires (or a TAB spider could be employed) as described above for FIG. 5. The transfer mold that is to apply encapsulation compound to form the package housing, includes recesses that define the package and these recesses have edges that mate with the inner edges of bead 27. When the transfer mold closes on the tape, with its bead and mounted semiconductor chip, the resilient bead will deform and seal the mold cavity. When the fluid encapsulant is forced into the mold the action of bead 27 will be to preclude the escape of any encapsulant outside of the mold. Thus, molding flash is avoided without resorting to dambars. Finally, if desired, after encapsulation, bead 27 can be removed. However, since it is an insulator, it can be left in place in the finished product.

It is to be understood that the dambarless approach can be employed by itself on any plastic encapsulated product. It can also be employed with the assembly structure and process disclosed in conjunction with FIGS. 1 through 5. In this operation two beads would be applied—one at location 27, as shown, and a second bead would be applied inboard of location 22 as is set forth in FIG. 5 as element 15. It is clear that these two beads would fully secure the tape fingers in place even though there are no dambars. Then the assembly process associated above, with respect to FIGS. 1 through 5, would be followed except that no subsequent dambar removal would be required. The molded plastic cavity package of FIG. 1 would result. The only difference would be the inclusion of a plastic bead on fingers 13 surrounding the plastic ring 12.

The invention has been described and a preferred embodiment detailed. Alternatives have also been described. When a person skilled in the art reads the foregoing description, other alternatives and equivalents, within the spirit and intent of the invention, will be apparent. Accordingly, it is intended that the scope of the invention be limited only by the claims that follow.

I claim:

1. A semiconductor chip package comprising:
    a lead frame having finger portion extensions that terminate inwardly in an array that is to be connected to the bonding pad pattern on a semiconductor chip and that extend outwardly to form a package pin array;
    a bead of resilient insulation material located upon said lead frame finger pattern to encompass the ends of the inwardly extending fingers;
    upper and lower plates that are flat, substantially rigid and larger in area than the area enclosed by said bead, said plates being pressed against said bead so that said outwardly extending finger portions extend outward beyond the edges of said plates;
    a molded insulative ring formed around the edges of said plates whereby said plates are joined together, said ring having an outer dimension that determines the periphery of said package with said outwardly extending fingers protruding through and beyond said molded ring; and
    a semiconductor chip having its bonding pads connected to said leadframe finger portion.

2. The package of claim 1 wherein said semiconductor chip bonding pads are connected to said lead frame fingers by means of wire bonds.

3. The package of claim 1 wherein said semiconductor chip bonding pads are connected to said leadframe fingers by means of assembly tape.

4. The package of claim 1 wherein a plurality of semiconductor chips are included.

5. The package of claim 1 wherein said molded insulative ring has upper and lower faces that are flush with the outer faces of said upper and lower plates.

6. The package of claim 1 wherein at least one of said plates is metal and said semiconductor chip is bonded in thermal relationship to said metal.

7. The package of claim 6 wherein said semiconductor chip is soldered to said metal plate.

8. The package of claim 6 wherein said semiconductor chip is cemented to said metal plate using a thermally conducting cement.

9. The package of claim 5 wherein said plates have edges that include means for keying them to said molded insulative ring whereby the plates are rigidly held in position after assembly.

10. The package of claim 5 wherein said plates are composed of ceramic.

11. The package of claim 10 wherein said ceramic is composed essentially of alumina and said semiconductor chip is secured to the inner face of one of said plates.

* * * * *